United States Patent
Maehara et al.

(10) Patent No.: US 10,566,525 B2
(45) Date of Patent: Feb. 18, 2020

(54) METHOD FOR MANUFACTURING MAGNETORESISTIVE ELEMENT

(71) Applicant: Tokyo Electron Limited, Tokyo (JP)

(72) Inventors: Hiroki Maehara, Yamanashi (JP); Naoki Watanabe, Yamanashi (JP); Kanto Nakamura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/008,659

(22) Filed: Jun. 14, 2018

(65) Prior Publication Data
US 2018/0366641 A1 Dec. 20, 2018

(30) Foreign Application Priority Data

Jun. 16, 2017 (JP) .................................. 2017-118845

(51) Int. Cl.
*H01L 43/12* (2006.01)
*H01L 43/10* (2006.01)

(52) U.S. Cl.
CPC .............. *H01L 43/12* (2013.01); *H01L 43/10* (2013.01)

(58) Field of Classification Search
CPC ......... H01L 43/12; H01L 43/10; H01L 43/08; G01R 33/09–098; G01R 15/205; G11B 5/39–3993; G11B 2005/3996; H03B 15/006
See application file for complete search history.

(56) References Cited

U.S. PATENT DOCUMENTS

| | | | |
|---|---|---|---|
| 2008/0191251 A1* | 8/2008 | Ranjan | B82Y 10/00 257/295 |
| 2009/0229111 A1* | 9/2009 | Zhao | B82Y 10/00 29/603.08 |
| 2010/0177449 A1 | 7/2010 | Zhao et al. | |
| 2012/0326250 A1* | 12/2012 | Gaidis | H01L 43/08 257/421 |
| 2016/0315250 A1* | 10/2016 | Guo | H01L 43/12 |
| 2017/0213957 A1* | 7/2017 | Hong | H01L 43/08 |
| 2018/0005746 A1* | 1/2018 | Thomas | B24B 37/20 |

FOREIGN PATENT DOCUMENTS

| | | |
|---|---|---|
| JP | 2010-093157 A | 4/2010 |
| JP | 2010-166051 | 7/2010 |
| KR | 10-2017-0002724 A | 1/2017 |
| WO | WO 2010/026725 A1 | 3/2010 |

\* cited by examiner

*Primary Examiner* — Shahed Ahmed
(74) *Attorney, Agent, or Firm* — Fenwick & West LLP

(57) ABSTRACT

A method for manufacturing a magnetoresistive element, includes: a first step of preparing a wafer including a first ferromagnetic layer and a first oxide layer provided directly on the first ferromagnetic layer; a second step of forming, after the first step, a second ferromagnetic layer directly on the first oxide layer; a third step of forming, after the second step, an absorbing layer directly on the second ferromagnetic layer; and a fourth step of crystallizing, after the third step, the second ferromagnetic layer by heat treatment. The second ferromagnetic layer contains boron, and the absorbing layer contains a material for absorbing boron from the second ferromagnetic layer by the heat treatment in the fourth step.

9 Claims, 10 Drawing Sheets

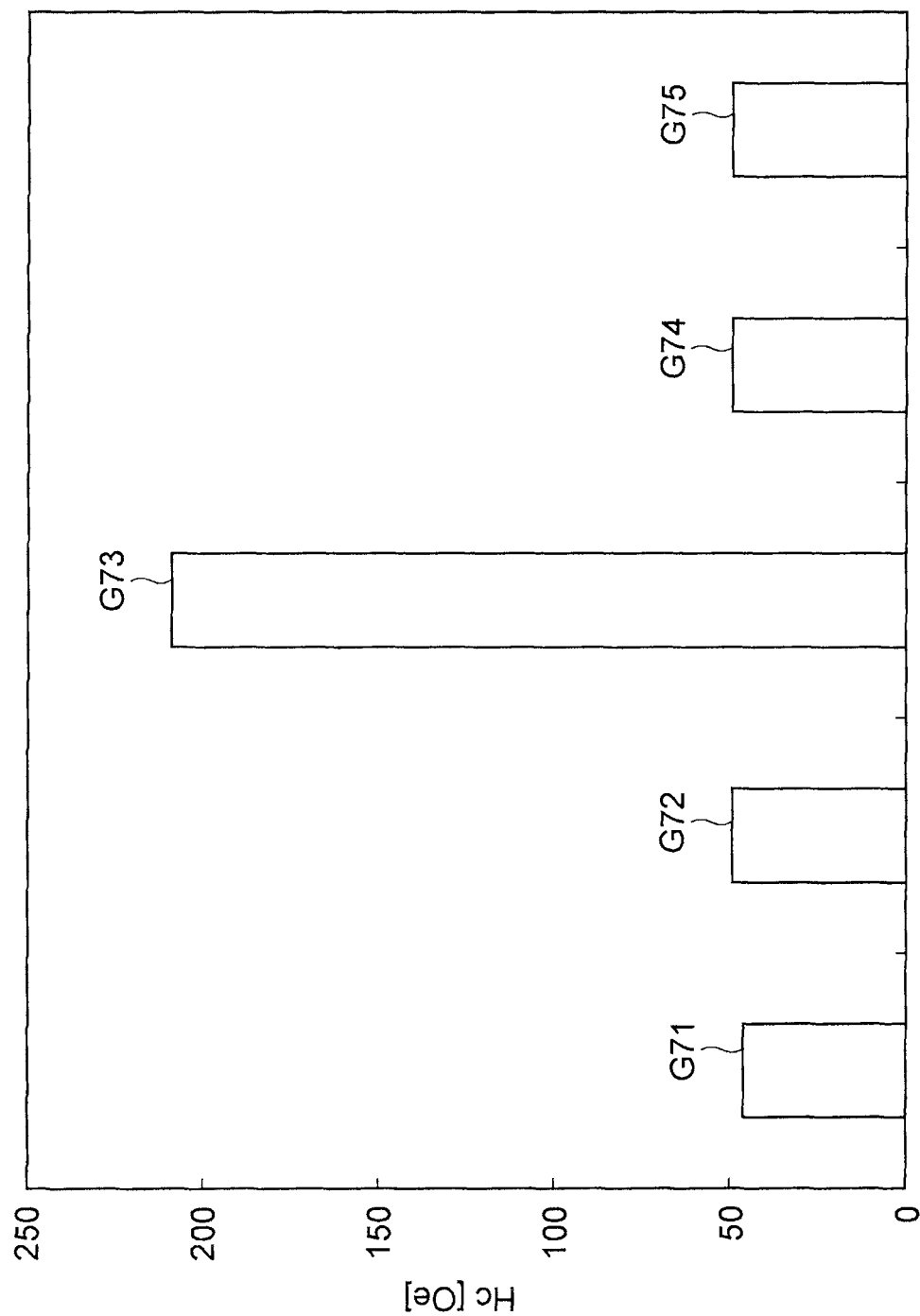

METHOD FOR MANUFACTURING MAGNETORESISTIVE ELEMENT

CROSS-REFERENCE TO RELATED APPLICATIONS

This application claims priority to Japanese Patent Application No. 2017-118845 filed on Jun. 16, 2017, the entire contents of which are incorporated herein by reference.

FIELD OF THE INVENTION

The present disclosure relates to a method for manufacturing a magnetoresistive element.

BACKGROUND OF THE INVENTION

A MRAM (Magnetoresistive Random Access Memory) preferably includes a magnetoresistive element having a relatively large magnetoresistive change ratio (MR ratio). A magnetoresistive element having a large MR ratio includes a tunnel magnetoresistance element in which a tunnel barrier layer is made of magnesium oxide. Solid phase epitaxial growth may be employed to realize a good crystal structure in manufacturing the magnetoresistive element. Japanese Patent Application Publication No. 2010-166051 discloses a technique related to a magnetoresistance effect element (magnetoresistive element) or the like. In the magnetoresistance effect element disclosed in Japanese Patent Application Publication No. 2010-166051, a free layer has a composite structure in which a first ferromagnetic layer, an insertion layer and a second ferromagnetic layer are laminated in that order from the tunnel barrier layer side.

Along with the trend toward a high density of MRAM, as a volume of the magnetoresistive element is decreased, a thermal stability index is decreased and, thus, stability of a magnetization direction against thermal disturbance deteriorates. Japanese Patent Application Publication No. 2010-166051 discloses a method in which annealing is performed after formation of a laminated film including a tunnel barrier layer, a free layer and a cap layer in manufacturing a magnetoresistance effect element. However, it is difficult to realize magnetic characteristics (particularly, anisotropic magnetic field) enough to suppress a decrease in the thermal stability index in the annealing performed after the formation of the laminated film including the cap layer. Therefore, it is preferable to provide a method for manufacturing a magnetoresistive element which can improve magnetic characteristics such as an anisotropic magnetic field and the like.

SUMMARY OF THE INVENTION

In accordance with an aspect, there is provided a method for manufacturing a magnetoresistive element, including: a first step of preparing a wafer including a first ferromagnetic layer and a first oxide layer provided directly on the first ferromagnetic layer; a second step of forming, after the first step, a second ferromagnetic layer directly on the first oxide layer; a third step of forming, after the second step, an absorbing layer directly on the second ferromagnetic layer; and a fourth step of crystallizing, after the third step, the second ferromagnetic layer by heat treatment, wherein the second ferromagnetic layer contains boron, and the absorbing layer contains a material for absorbing boron from the second ferromagnetic layer by the heat treatment in the fourth step.

BRIEF DESCRIPTION OF THE DRAWINGS

The objects and features of the present disclosure will become apparent from the following description of embodiments, given in conjunction with the accompanying drawings, in which:

FIG. 10 explains an effect of the heat treatment.

DETAILED DESCRIPTION OF THE EMBODIMENTS

Figure 1:
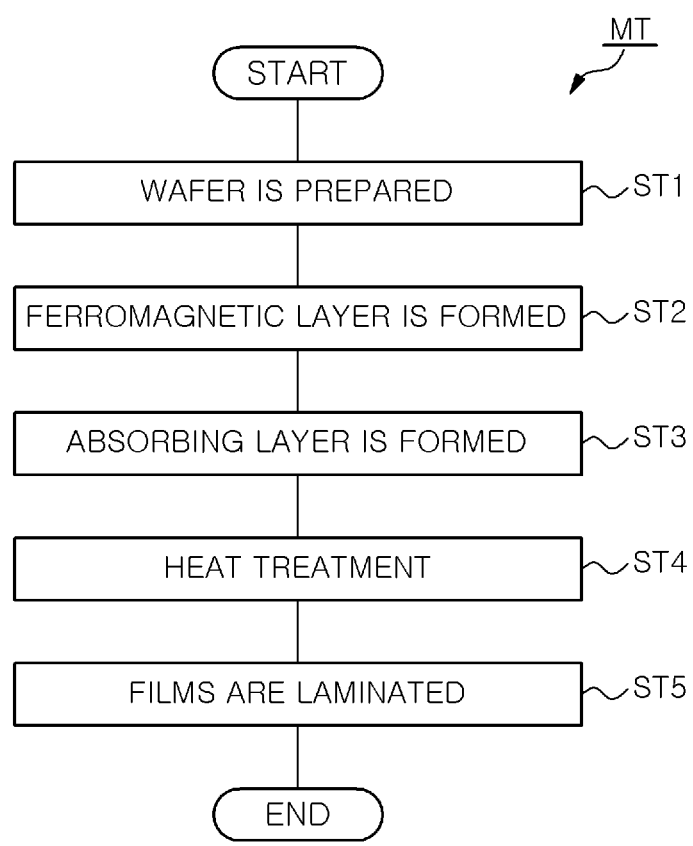
FIG. 1 is a flowchart showing a manufacturing method according to an embodiment.

Hereinafter, various embodiments will be described in detail with reference to the accompanying drawings. Like reference numerals will be given to like or corresponding parts throughout the drawings. Hereinafter, a manufacturing method (manufacturing method MT) of a magnetoresistive element which can be performed by using a film forming apparatus 10 will be described with reference to FIG. 1. FIG. 1 is a flowchart showing a manufacturing method (manufacturing method MT) according to one embodiment. The manufacturing method MT according to one embodiment shown in FIG. 1 is used for manufacturing a wafer W (magnetoresistive element).

Figure 2:
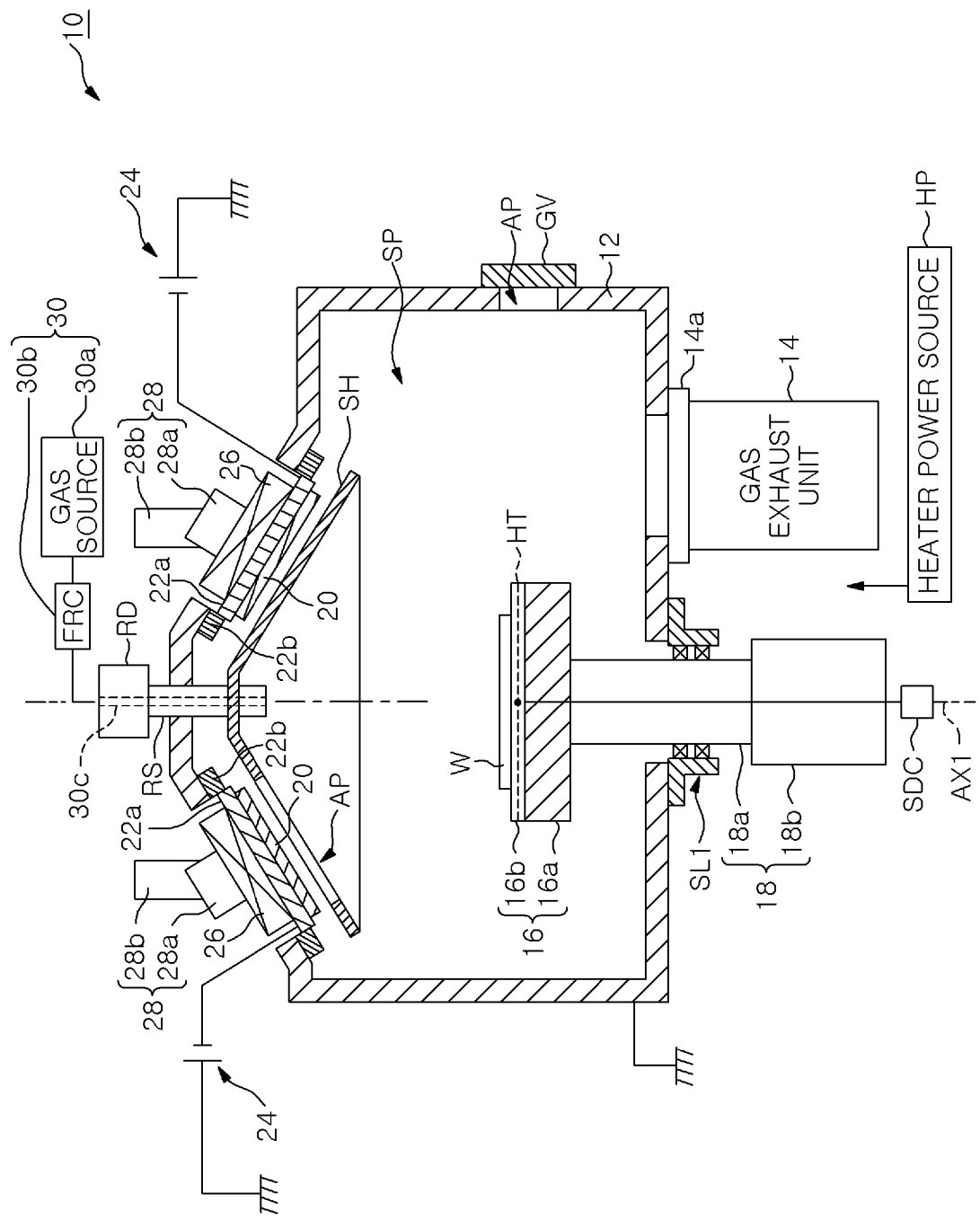
FIG. 2 shows an example of a configuration of a film forming apparatus used for performing the manufacturing method shown in FIG. 1.

FIG. 2 schematically shows the film forming apparatus 10 used for performing the manufacturing method MT according to one embodiment. FIG. 2 shows a vertical cross section of the film forming apparatus 10. First, a configuration of the film forming apparatus 10 will be described with reference to FIG. 2. The film forming apparatus 10 shown in FIG. 2 includes a processing chamber 12. The processing chamber 12 is connected to a ground potential. The processing chamber 12 may be made of, e.g., aluminum or the like. The processing chamber 12 defines a processing space SP therein. A gas exhaust unit 14 for decreasing a pressure in the processing space SP is connected to a bottom portion of the processing chamber 12 through an adapter 14a. An opening AP for transferring the wafer W is formed on a sidewall of the processing chamber 12, and a gate valve GV for opening and closing the opening AP is provided at the sidewall.

A stage 16 is provided in the processing chamber 12. The stage 16 includes a base portion 16a and an electrostatic chuck 16b. The base portion 16a has a substantially disc shape. The base portion 16a may be made of, e.g., aluminum or the like. In one embodiment, a cooling device may be provided in the base portion 16a. The cooling device may include a coolant flow path for circulating a coolant.

An electrostatic chuck 16b is provided on the base portion 16a. The electrostatic chuck 16b has a dielectric film and an electrode provided as an inner layer in the dielectric film. A DC power source SDC is connected to the electrode of the electrostatic chuck 16b. The wafer W mounted on the electrostatic chuck 16b is attracted onto the electrostatic chuck 16b by electrostatic force generated by the electrostatic chuck 16b. A heater HT is provided in the electrostatic chuck 16b. The heater HT generates heat by electric power supplied from the heater power source HP. A temperature of the electrostatic chuck 16b and a temperature of the wafer W mounted on the electrostatic chuck 16b can be controlled by the heater HT.

The stage 16 is connected to a stage driving unit 18. The stage driving unit 18 includes a support shaft 18a and a driving device 18b. The support shaft 18a is a substantially columnar member. A center axis of the support shaft 18a substantially coincides with a center axis AX1 extending along a vertical direction. The central axis AX1 is an axis passing through the center of the wafer W mounted on the electrostatic chuck 16b, i.e., the center of the stage 16 in the vertical direction. The support shaft 18a extends from directly below the stage 16 to the outside of the processing chamber 12 through the bottom portion of the processing chamber 12. A sealing member SL1 is provided between the support shaft 18a and the bottom portion of the processing chamber 12. The sealing member SL1 seals a space between the bottom portion of the processing chamber 12 and the support shaft 18a so that the support shaft 18a can rotate and move vertically. The sealing member SL1 may be made of, e.g., a magnetic fluid seal.

The stage 16 is coupled to an upper end of the support shaft 18a, and the driving device 18b is connected to a lower end of the support shaft 18a. The driving device 18b generates power for rotating and vertically moving the support shaft 18a. The stage 16 rotates about the central axis AX1 in accordance with the rotation of the support shaft 18a by the power generated by the driving device 18b. The stage 16 is moved vertically in accordance with the vertical movement of the support shaft 18a by the power generated by the driving device 18b.

Three or more targets 20 (cathode targets) are provided above the stage 16. A shutter SH is provided between the targets 20 and the stage 16. A plurality of magnets 26 (cathode magnets) is provided outside the processing chamber 12 to face the corresponding targets 20 through holders 22a.

Each of the targets 20 has a substantially rectangular flat plate shape. In other words, each of the targets 20 has edges along four sides of the rectangle. The targets 20 are arranged substantially equally along a circle about the center axis AX1. In other words, the targets 20 are arranged at a substantially uniform interval in a circumferential direction with respect to the center axis AX1. The targets 20 are inclined with respect to the center axis AX1 so that the surfaces of the targets 20 on the side of the stage 16 are directed to the stage 16. The targets 20 are arbitrarily selected depending on a type of a film to be formed. In one embodiment, the targets 20 are made of different metals.

The targets 20 are held by metal holders 22a. Each of the holders 22a is supported at a ceiling portion of the processing chamber 12 through an insulating member 22b. A power supply 24 is connected to the targets 20 through the holders 22a. The power supply 24 applies a negative DC voltage to the targets 20. The power supply 24 may be a single power supply that selectively applies a voltage to the targets 20. Alternatively, the power supply 24 may be a plurality of power supplies connected to the targets 20, respectively.

The shutter SH is provided between the targets 20 and the stage 16. The shutter SH extends to face the surfaces of the targets 20. In one embodiment, the shutter SH has a shape conforming to a conical surface having the central axis AX1 as its central axis.

The shutter SH is provided with the opening AP. The opening AP can selectively expose one of the targets 20 to the stage 16. Further, the opening AP can simultaneously expose two or more targets among the plurality of targets 20 to the stage 16. Hereinafter, among the targets 20, one or two or more targets facing the opening AP and exposed to the stage 16 from the opening AP will be referred to as "exposed targets". In the entire region of the exposed target, a region facing the opening AP and exposed to the stage 16 through the opening AP, i.e., an unblocked region, is referred to as an "exposed region".

The opening AP has a planar size that is substantially equal to the planar size of each of the targets 20. The opening AP has a size that allows an entire region of one target 20 selected among the plurality of targets 20 to be exposed to the stage 16.

A rotating shaft RS is coupled to a central portion of the shutter SH. The rotating shaft RS is a substantially columnar member. The center axis of the rotating shaft RS substantially coincides with the central axis AX1. One end of the rotating shaft RS is coupled to the central portion of the shutter SH in the processing chamber 12. The rotating shaft RS extends from the inside of the processing chamber 12 to the outside of the processing chamber 12 while passing through an upper portion of the processing chamber 12. At the outside of the processing chamber 12, the other end of the rotating shaft RS is connected to a rotation driving device RD. The rotation driving device RD generates power for rotating the rotating shaft RS. The shutter SH can rotate about the central axis AX1 as the rotating shaft RS rotates about the central axis AX1 by the power. With the rotation of the shutter SH, the position of the opening AP in the circumferential direction can be adjusted.

The magnets 26 are disposed outside the processing chamber 12 to face the corresponding targets 20. The film forming apparatus 10 includes a plurality of scanning mechanisms 28 for scanning the magnets 26. Each of the scanning mechanisms 28 can scan a corresponding one of the magnets 26 in a tangential direction of a circle about the central axis AX1.

In one embodiment, each of the scanning mechanisms 28 may include a guide portion 28a and a driving device 28b. The guide portion 28a is a guide body such as a rail or the like which extends in the tangential direction. The driving device 28b generates power for moving the magnet 26 along the guide portion 28a. The scanning mechanism 28 can scan the magnet 26 corresponding to the exposed target within a scanning range facing the opening AP. In other words, the magnet 26 can be scanned within the scanning range corresponding to a width of the exposed region. Therefore, in the film forming apparatus 10, it is possible to limit the region where the plasma density is high to the vicinity of the exposed region.

The film forming apparatus 10 includes a gas supply unit 30 for supplying a gas into the processing chamber 12. In one embodiment, the gas supply unit 30 includes a gas source 30a, a flow rate controller (FRC) 30b such as a mass flow controller, and a gas introduction unit 30c. The gas source 30a is a source of a gas excited in the processing chamber 12. The gas source 30a is connected to the gas introduction unit 30c via the flow rate controller 30b. The gas introduction unit 30c is a gas line for introducing the gas from the gas source 30a into the processing chamber 12. In one embodiment, the gas introduction unit 30c extends along the central axis AX1.

When gas is supplied from the gas supply unit 30 into the processing chamber 12 and a voltage is applied to the exposed target by the power supply 24, the gas supplied into the processing chamber 12 is excited. When the corresponding magnet 26 is scanned by the scanning mechanism 28, a magnetic field is generated near the exposed region of the exposed target. Accordingly, plasma is concentrated near the exposed region. Positive ions in the plasma collide with the exposed region of the exposed target, thereby releasing substances from the exposed target. As a result, the substances forming the exposed target are deposited on the wafer W.

Figure 3:
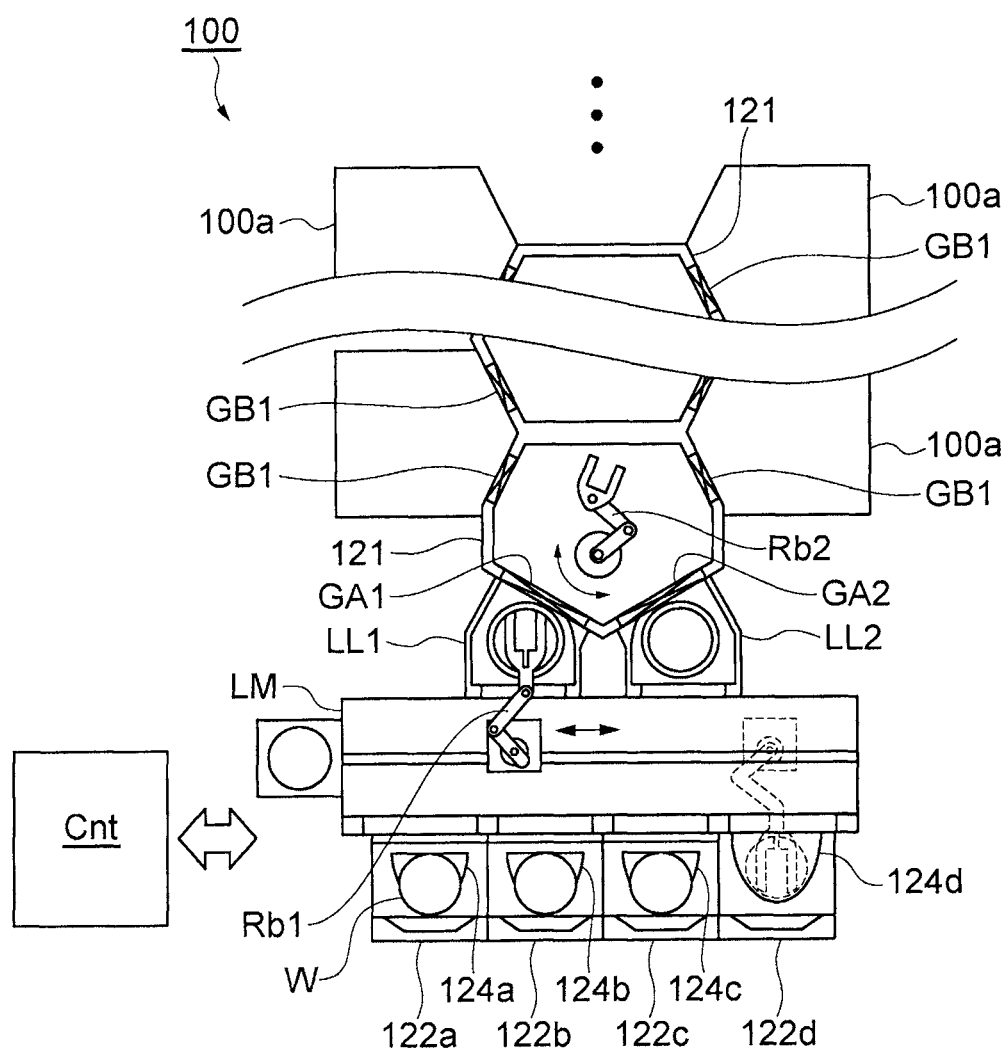
FIG. 3 shows an example of a configuration of a processing system including the film forming apparatus shown in FIG. 2.

The film forming apparatus 10 shown in FIG. 2 is accommodated in any one of a plurality of processing modules 100a of a processing system 100 shown in FIG. 3. FIG. 3 shows an example of a main configuration of the processing system 100 including the film forming apparatus 10 shown in FIG. 2.

The processing system 100 includes bases 122a to 122d, accommodating containers 124a to 124d, a loader module LM, a transfer robot Rb1, a control unit Cnt, load-lock chambers LL1 and LL2, and gates GA1 and GA2. The processing system 100 further includes a plurality of transfer chambers 121, a plurality of processing modules 100a, and a plurality of gates GB1. The transfer chamber 121 includes a transfer robot Rb2.

The gate GA1 is provided between the load-lock chamber LL1 and the transfer chamber 121 in contact with the load-lock chamber LL1. The wafer W is transferred between the load-lock chamber LL1 and the transfer chamber 121 in contact with the load-lock chamber LL1 through the gate GA1 by the transfer robot Rb2. The gate GA2 is provided between the load-lock chamber LL2 and the transfer chamber 121 in contact with the load-lock chamber LL2. The wafer W is transferred between the load-lock chamber LL2 and the transfer chamber 121 in contact with the load-lock chamber LL2 through the gate GA2 by the transfer robot Rb2.

The gates GB1 are provided between the processing modules 100a and the transfer chambers 121 in contact with the processing modules 100a. The wafer W is transferred between the processing modules 100a and the transfer chambers 121 in contact with the processing modules 100a through the gates GB1 by the transfer robot Rb2.

The stands 122a to 122d are arranged along one side of the loader module LM. The accommodating containers 124a to 124d are mounted on the bases 122a to 122d, respectively. Wafers W can be accommodated in the accommodating containers 124a to 124d.

The transfer robot Rb1 is provided in the loader module LM. The transfer robot Rb1 takes out the wafer W accommodated in any one of the accommodating containers 124a to 124d and transfers the wafer W to the load-lock chamber LL1 or LL2.

The load-lock chambers LL1 and LL2 are provided along another side of the loader module LM and are connected to the loader module LM. The load-lock chambers LL1 and LL2 constitute a preliminary decompression chamber. The load-lock chambers LL1 and LL2 are connected to the transfer chamber 121 through the gates GA1 and GA2, respectively.

The transfer chambers 121 are depressurizable chambers. The transfer robot Rb2 is provided in each of the transfer chambers 121. The transfer chambers 121 are connected to the processing modules 100a where the film forming apparatuses 10 are provided. The transfer robot Rb2 takes out the wafer W from the load-lock chamber LL1 or LL2 through the gate GA1 or GA2 and transfers the wafer W to the film forming apparatus 10.

A depressurized atmosphere is realized in each of the transfer chambers 121 and the processing modules 100a. The transfer chambers 121 and the processing modules 100a have a common pressure (pressure after decompression). The transfer chambers 121 and the processing modules 100a form a consistent vacuum environment. Even when the wafer W is transferred between the transfer chambers 121 and the processing modules 100a, the consistent vacuum environment is maintained. Since the film forming apparatus 10 includes the heater HT as described above, both the film forming process and the annealing process can be performed in a consistent vacuum environment.

The control unit Cnt is a computer including a processor, a storage unit, an input device, a display device, and the like. The control unit Cnt controls the respective components of the processing system 100. The control unit Cnt is connected to the transfer robots Rb1 and Rb2, various devices (e.g., the film forming apparatus 10) provided in each of the processing modules 100a, and the like. The respective components of the processing system 100, e.g., the transfer robots Rb1 and Rb2, and the respective components of the film forming apparatus 10 are controlled by control signals from the control unit Cnt. A computer program for controlling the respective components of the processing system 100 and various data used for executing the program are readably stored in the storage unit of the control unit Cnt.

In one embodiment, the control unit Cnt further controls the respective components of the film forming apparatus 10. Specifically, the control unit Cnt controls the rotational position of the shutter SH by transmitting a control signal to the rotation driving device RD. Accordingly, the control unit Cnt can allow one exposed target or two or more exposed targets among the plurality of targets 20 to be exposed to the stage 16 through the opening AP. The control unit Cnt transmits a control signal to the flow rate controller 30b of the gas supply unit 30. Accordingly, the control unit Cnt can allow the gas supply unit 30 to supply a gas at a predetermined flow rate into the processing chamber 12. The control unit Cnt transmits a control signal to the gas exhaust unit 14. Accordingly, the control unit Cnt can set a pressure in the processing chamber 12 to a predetermined level. The control unit Cnt transmits a control signal to the heater power supply HP. Accordingly, the control unit Cnt can allow the heater HT to heat the electrostatic chuck 16b and heat the wafer W mounted on the electrostatic chuck 16b. The control unit Cnt transmits a control signal to the power supply 24. Accordingly, the control unit Cnt can apply a negative DC voltage to the exposed target. The control unit Cnt transmits control signals to the driving devices 28b of the scanning mechanisms 28. Accordingly, the control unit Cnt can scan a corresponding magnet 26 within the scanning range corresponding to the width of the exposure area of the exposed target.

Figure 4:
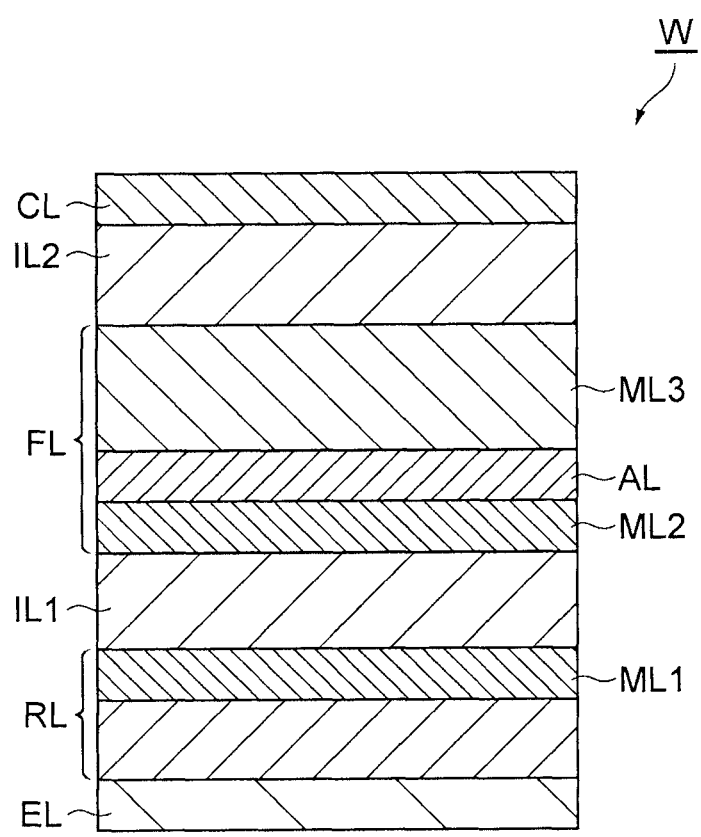
FIG. 4 is a cross sectional view showing an example of a configuration of a magnetoresistive element manufactured by the manufacturing method shown in FIG. 1.
Figure 5A:
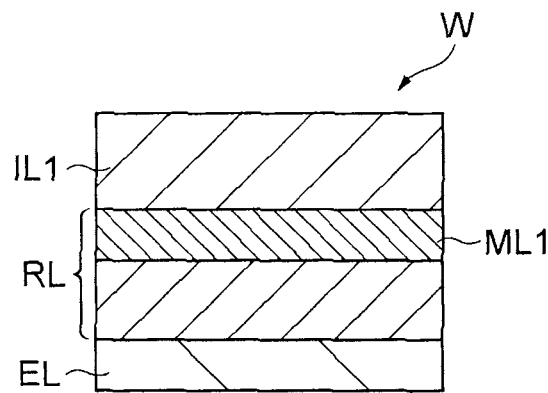
FIG. 5A is a cross sectional view schematically showing a state of a wafer before the execution of the manufacturing method shown in FIG. 1, and FIGS. 5B and 5C are cross sectional views schematically showing a state of a wafer after the execution of each step of the manufacturing method shown in FIG. 1.
Figure 5B:
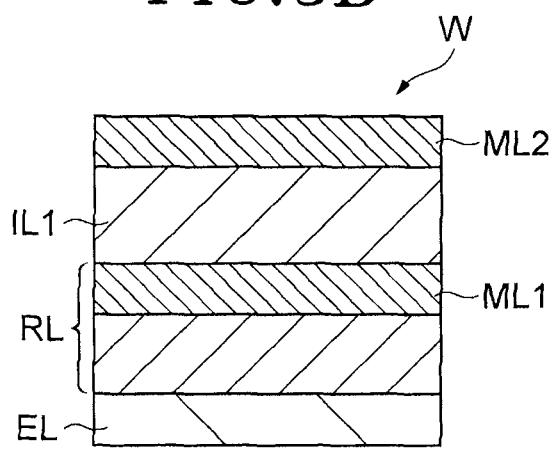
Figure 5C:
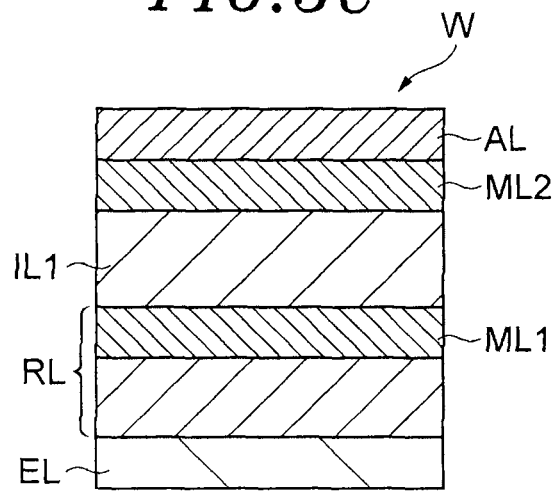

Referring back to FIG. 1, the manufacturing method MT will be described. In the following description, FIGS. 4 and 5 will be referred to. FIG. 4 is a cross sectional view showing an example of a configuration of a magnetoresistive element manufactured by the manufacturing method shown in FIG. 1. FIG. 5A schematically shows the state of the wafer before the execution of the manufacturing method shown in FIG. 1. FIGS. 5B and 5C are cross sectional views schematically showing the state of the wafer after the execution of each step of the manufacturing method shown in FIG. 1.

The wafer W (magnetoresistive element) shown in FIG. 4 includes a lower electrode layer EL, a magnetization reference layer RL, an oxide layer IL1 (first oxide layer), a magnetization free layer FL, an oxide layer IL2 (second oxide layer), and a cap layer CL. The magnetization reference layer RL includes a ferromagnetic layer ML1 (first ferromagnetic layer). The magnetization free layer FL includes a ferromagnetic layer ML2 (second ferromagnetic layer), an absorbing layer AL, and a ferromagnetic layer ML3 (third ferromagnetic layer). The magnetization reference layer RL is provided on the lower electrode layer EL. The oxide layer IL1 is provided directly on the ferromagnetic layer ML1 of the magnetization reference layer RL. The ferromagnetic layer ML2 is provided directly on the oxide layer IL1. The absorbing layer AL is provided directly on the ferromagnetic layer ML2. The ferromagnetic layer ML3 is provided directly on the absorbing layer AL. The oxide layer IL2 is provided directly on the magnetization free layer FL. In one embodiment, the oxide layer IL2 is provided directly on the ferromagnetic layer ML3. The cap layer CL is provided on the oxide layer IL2.

The oxide layers IL1 and IL2 contain magnesium oxide (MgO) oriented in (001) orientation. All the ferromagnetic layers ML1 to ML3 have a face-centered cubic lattice structure and contain boron. In one embodiment, each of the ferromagnetic layers ML1 to ML3 may contain cobalt, iron and boron (CoFeB). The absorbing layer AL contains a material that absorbs boron from the ferromagnetic layer ML2 to be described later with reference to FIGS. 5B and 5C by heat treatment in a step ST4 to be described later. In one embodiment, the absorber layer AL may contain any one of tungsten, molybdenum, tantalum, chromium, vanadium, and niobium. When the thickness of the absorbing layer AL is less than 0.1 nm, the function of the absorbing layer is not sufficiently obtained. When the thickness of the absorbing layer AL exceeds 1.0 nm, the magnetic characteristics deteriorate. Therefore, the film thickness of the absorbing layer AL is greater than or equal to 0.1 nm and smaller than or equal to 1.0 nm. In one embodiment, the thickness of the absorbing layer AL may be 0.4 nm.

In the manufacturing method MT shown in FIG. 1, the magnetoresistive element (wafer W) having a configuration shown in FIG. 4 is manufactured by laminating the magnetization free layer FL, the oxide layer IL2, and the cap layer CL, on the oxide layer IL1 shown in FIG. 5A, as can be seen from FIGS. 5B and 5C. The manufacturing method MT includes steps ST1 to ST5 (first to fifth step). The steps ST1 to ST5 are executed in a consistent vacuum environment in the processing system 100 including the film forming apparatus 10.

First, in the step ST1, the wafer W having the structure shown in FIG. 5A is prepared in the processing space SP of the film forming apparatus 10. In the step ST1, the wafer W is mounted on the electrostatic chuck 16b. The wafer W shown in FIG. 5A includes the lower electrode layer EL, the magnetization reference layer RL, and the oxide layer IL1. The magnetization reference layer RL includes the ferromagnetic layer ML1. The wafer W shown in FIG. 5A includes the ferromagnetic layer ML1 and the oxide layer IL1 provided directly on the ferromagnetic layer ML1. The ferromagnetic layer ML1 of the wafer W prepared in the step ST1 is in an amorphous or microcrystalline state.

After the step ST1, the ferromagnetic layer ML2 is formed directly on the oxide layer IL1 as shown in FIG. 5B (step ST2). The oxide layer IL1 is formed by a sputtering method using an oxide target or by a method of forming a metal thin film and performing oxidation. The ferromagnetic layer ML2 formed in the step ST2 is in an amorphous or microcrystalline state.

After the step ST2, the absorbing layer AL is formed directly on the ferromagnetic layer ML2 by using the sputtering method as shown in FIG. 5C (step ST3).

After the step ST3, heat treatment is performed to crystallize the ferromagnetic layer ML2 in an amorphous or microcrystalline state (step ST4). In the step ST4, the ferromagnetic layer ML1 as well as the ferromagnetic layer ML2 may be crystallized. In the step ST4, the heat treatment is performed at a temperature ranging from 300° C. to 450° C.

In the heat treatment of the step ST4, solid phase epitaxy is used. In other words, the ferromagnetic layers ML1 and ML2 in the amorphous or microcrystalline state are crystallized in accordance with the crystal structure of (001) orientation of the magnesium oxide of the oxide layer IL1 by the heat treatment of the step ST4.

In the heat treatment of the step ST4, a part of boron in the ferromagnetic layer ML2 is absorbed by the absorbing layer AL having a high boron absorption property. A part of the boron in the ferromagnetic layer ML2 moves to the absorbing layer AL and, thus, the concentration of boron in the ferromagnetic layer ML2 is decreased. Accordingly, the magnetic characteristics of the ferromagnetic layer ML2 are improved. In this manner, the ferromagnetic layer ML2 having good magnetic characteristics is formed by the heat treatment in the step ST4. When the film forming apparatus 10 has an electromagnet, the heat treatment can be performed while applying a magnetic field in the step ST4. In the case where a dedicated heat treatment apparatus is provided as one of the processing modules of the processing system 100, the heat treatment may be performed after the wafer W is moved to the dedicated heat treatment apparatus.

The duration of the heat treatment in the step ST4 is, e.g., about 100 to 700 sec. The duration of the heat treatment in the step ST4 may be about 300 sec in one embodiment.

After the step ST4, the ferromagnetic layer ML3 is formed directly on the absorbing layer AL by using the sputtering method, and the oxide layer IL2 is formed directly on the ferromagnetic layer ML3 (step ST5). The oxide layer IL2 is formed by the sputtering method using an oxide target or by a method of forming a metal thin film and performing oxidation. In the step ST5, the cap layer CL is further formed together with the ferromagnetic layer ML3 and the oxide layer IL2. The cap layer CL is formed on the oxide layer IL2. After the formation of the cap layer CL, heat treatment may be performed by batch processing. The heat treatment performed after the formation of the cap layer CL is performed at a temperature ranging from, e.g., 300° C. to 450° C. In one embodiment, the heat treatment performed after the formation of the cap layer CL may be performed at about 400° C. The wafer W (magnetoresistive element) having the structure shown in FIG. 4 is obtained by the processes including the manufacturing method MT.

Figure 6:
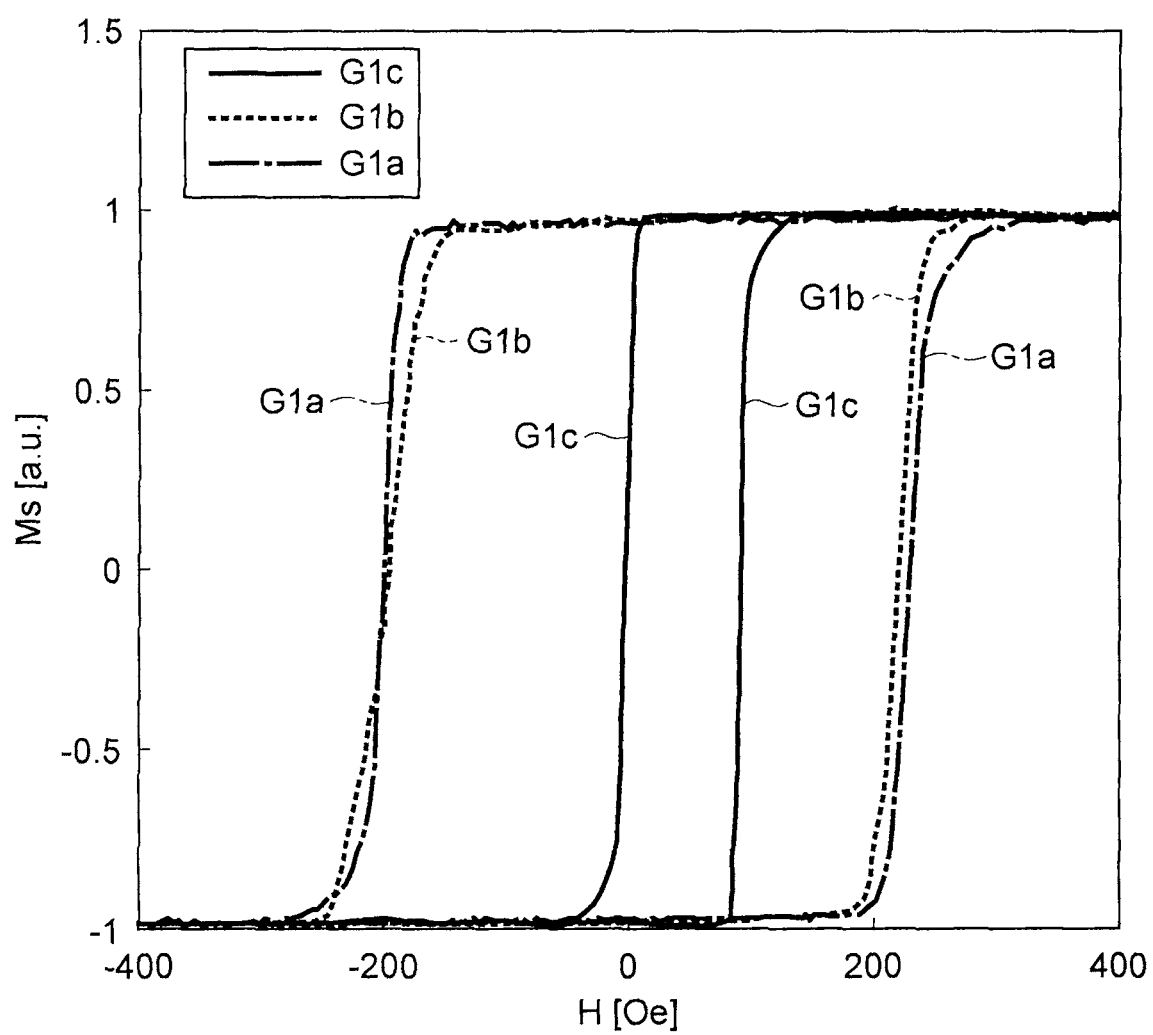
FIG. 6 explains magnetic hysteresis of the magnetoresistance element.

Next, the magnetic characteristics and the like of the wafer W (magnetoresistive element) having the structure shown in FIG. 4 which is obtained by the manufacturing method MT will be described with reference to FIGS. 6 to 10. FIG. 6 explains magnetic hysteresis of the magnetoresistive element. In FIG. 6, the horizontal axis represents an external magnetic field H [Oe], and the vertical axis represents normalized magnetization Ms [a.u.]. Graphs G1a and G1b show magnetic hysteresis of the magnetoresistive element (the wafer W having the structure shown in FIG. 4) having the structure shown in FIG. 4 which is obtained by performing the heat treatment at the timing of the step ST4. A graph G1c shows the magnetic hysteresis of the magnetoresistive element obtained without performing the heat treatment in the step ST4. The graph G1a shows the result obtained by performing the heat treatment at 450° C. The graph G1b shows the result obtained by performing the heat treatment at 400° C. As can be seen from the graph G1c, the coercive force Hc [Oe] of the magnetoresistive element obtained without performing the heat treatment is about 50 [Oe]. However, as can be seen form the graphs G1a and G1b, the coercive force Hc [Oe] of the wafer W obtained by performing the heat treatment at the timing of the step ST4 was about 200 [Oe]. The results shown in FIG. 6 show that better magnetic hysteresis is realized by the wafer W obtained by performing the heat treatment at the timing of the step ST4 than by the magnetoresistive element obtained without performing the heat treatment. The coercive force Hc [Oe] corresponds to ½ of the width [Oe] of the value of the magnetic field in which the magnetic field inversion occurs by the external magnetic field H [Oe].

Figure 7:
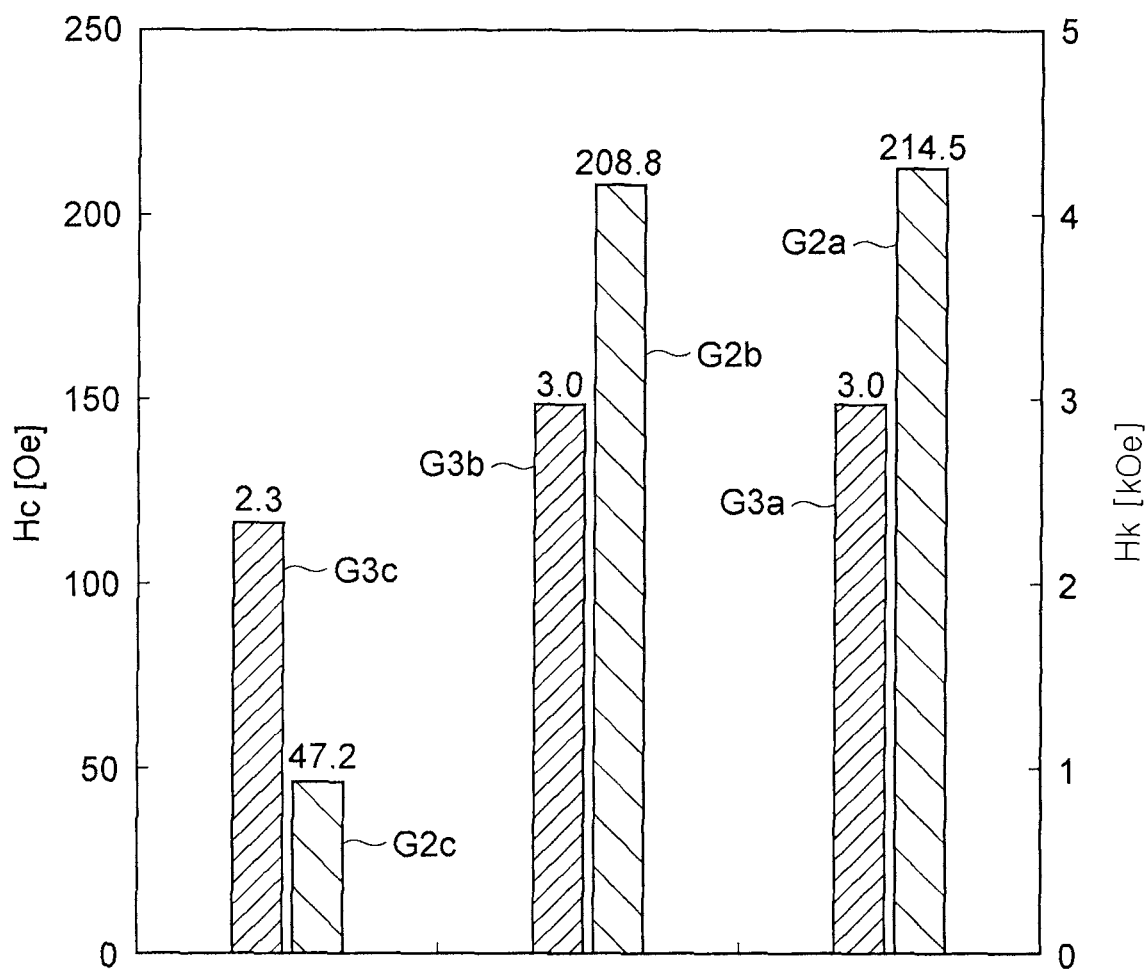
FIG. 7 explains a coercive force and an anisotropic magnetic field of the magnetoresistive element.

FIG. 7 explains the coercive force and the anisotropic magnetic field of the magnetoresistive element. FIG. 7 shows the coercive force Hc [Oe] and the anisotropic magnetic field Hk [kOe] of the magnetoresistive element obtained without performing the heat treatment and the coercive force Hc [Oe] and the anisotropic magnetic field Hk [kOe] of the magnetoresistive element (the wafer W having the structure shown in FIG. 4) obtained by performing the heat treatment at two different temperatures at the timing of the step ST4. The vertical axis on the left side of FIG. 7 represents the coercive force Hc [Oe], and the vertical axis on the right side of FIG. 7 represents the anisotropic magnetic field Hk [kOe].

A graph G2a shows a value (214.5 [Oe]) of the coercive force Hc [Oe] of the wafer W having the structure shown in FIG. 4 obtained by performing the heat treatment at 450° C. at the timing of the step ST4. A graph G3a shows a value (3.0 [kOe]) of the anisotropic magnetic field Hk [kOe] of the wafer W having the structure shown in FIG. 4 obtained by performing the heat treatment at 450° C. at the timing of the step ST4. A graph G2b shows a value (208.8 [Oe]) of the coercive force Hc [Oe] of the wafer W having the structure shown in FIG. 4 obtained by performing the heat treatment at 400° C. at the timing of the step ST4. A graph G3b shows a value (3.0 [kOe]) of the anisotropic magnetic field Hk [kOe] of the wafer W having the structure shown in FIG. 4 obtained by performing the heat treatment at 400° C. at the timing of the step ST4. A graph G2c shows a value (47.2 [Oe]) of the coercive force Hc [Oe] of the magnetoresistive element obtained without performing the heat treatment in the step ST4. A graph G3c shows a value (2.3 [kOe]) of the anisotropic magnetic field Hk [kOe] of the magnetoresistive element obtained without performing the heat treatment in the step ST4. The results shown in FIG. 7 indicate that better magnetic characteristics such as the coercive force Hc [Oe] and the anisotropic magnetic field Hk [kOe] are obtained by the wafer W having the structure shown in FIG. 4 obtained by performing the heat treatment at the timing of the step ST4 than by the magnetoresistance element obtained without performing the heat treatment.

Figure 8:
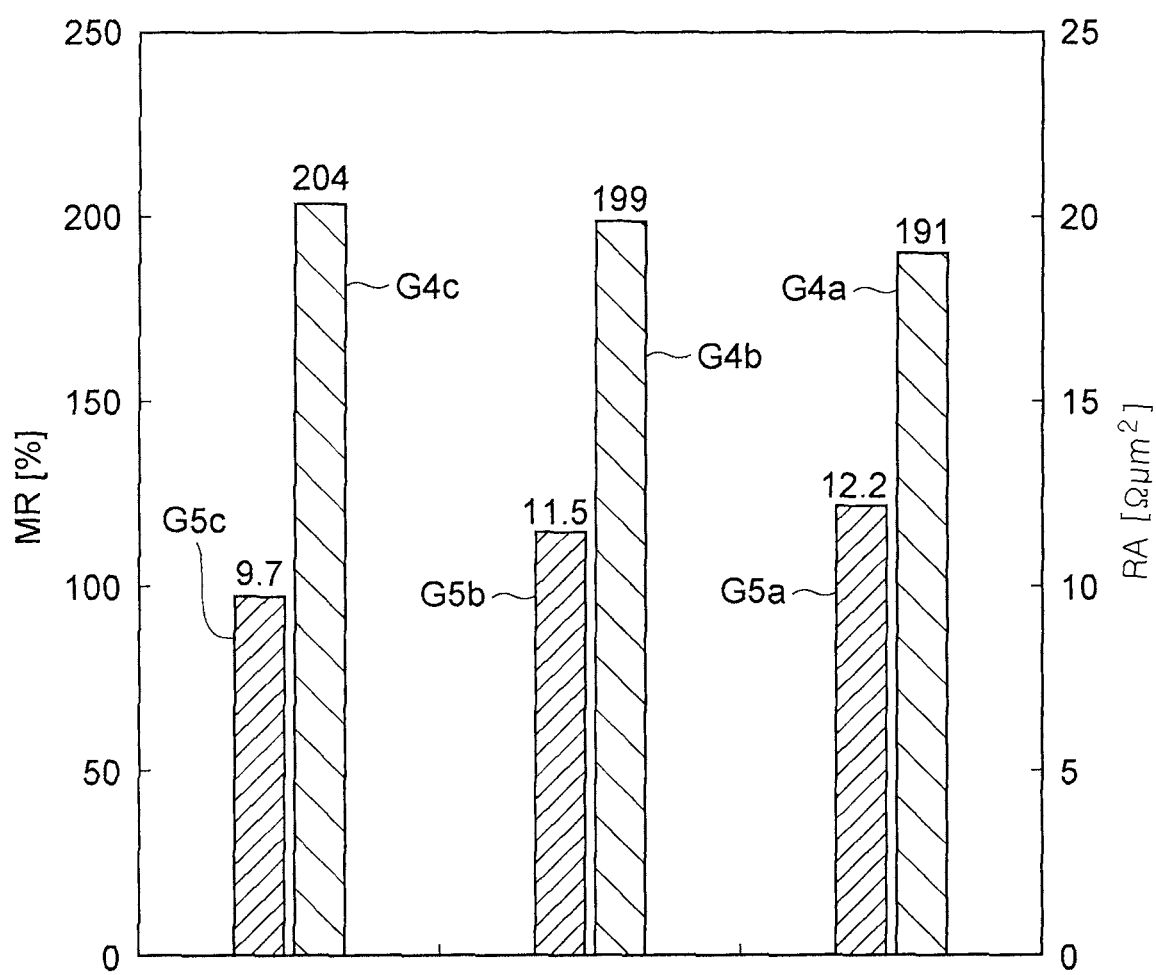
FIG. 8 explains a magnetoresistance change ratio and a magnetoresistance of the magnetoresistive element.

FIG. 8 explains a magnetoresistance change ratio and a magnetoresistance of the magnetoresistive element. FIG. 8 shows the magnetoresistance change ratio MR [%] and the sheet resistance RA [Ωμm$^2$] of the magnetoresistive element obtained without performing the heat treatment in the step ST4 and the magnetoresistance change ratio MR [%] and the sheet resistance RA [Ωμm$^2$] of the magnetoresistive element (the wafer W having the structure shown in FIG. 4) obtained by performing the heat treatment at two different temperatures at the timing of the step ST4. The vertical axis on the left side of FIG. 8 represents the magnetoresistance change ratio MR [%], and the vertical axis on the right side of FIG. 8 represents the sheet resistance RA [Ωμm$^2$].

A graph G4a shows a value (191[%]) of the magnetoresistance change ratio MR [%] of the wafer W having the structure shown in FIG. 4 obtained by performing the heat treatment at 450° C. at the timing of the step ST4. A graph G5a shows a value (12.2 [Ωμm$^2$]) of the sheet resistance RA[Ωμm 2] of the wafer W having the structure shown in FIG. 4 obtained by performing the heat treatment at 450° C. at the timing of the step ST4. A graph G4b shows a value (199[%]) of the magnetoresistance change ratio MR [%] of the wafer W having the structure shown in FIG. 4 obtained by performing the heat treatment at 400° C. at the timing of the step ST4. A graph G5b shows a value (11.5 [Ωμm$^2$]) of the sheet resistance RA [Ωμm$^2$] of the wafer W having the structure shown in FIG. 4 obtained by performing the heat treatment at 400° C. at the timing of the step ST4. A graph G4c shows a value (204[%]) of the magnetoresistance change ratio MR [%] of the magnetoresistive element obtained without performing the heat treatment in the step ST4. A graph G5c shows a value (9.7 [Ωμm$^2$]) of the sheet resistance RA [Ωμm$^2$] of the magnetoresistive element obtained without performing the heat treatment in the step ST4. The results shown in FIG. 8 indicate that the heat treatment performed at the timing of the step ST4 does not adversely affect the magnetoresistive change ratio MR [%] and the sheet resistance RA [Ωμm$^2$] of the wafer W having the structure shown in FIG. 4.

Figure 9:
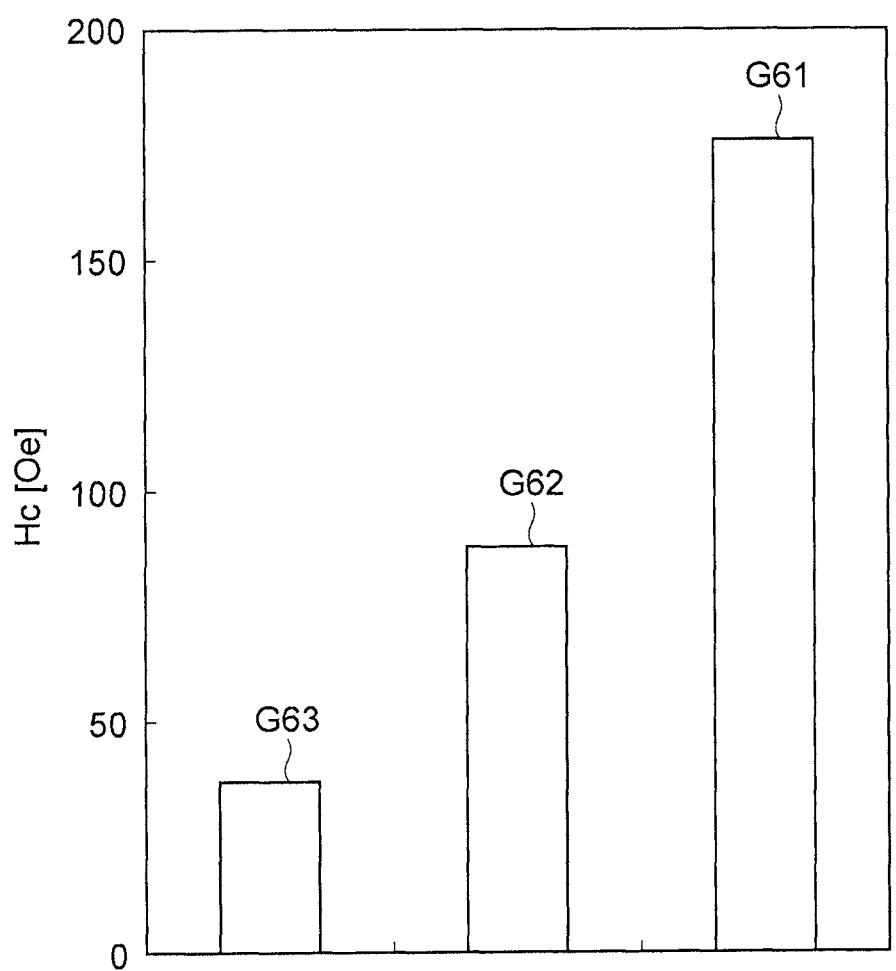
FIG. 9 shows relation between a temperature of heat treatment and the coercive force.

FIG. 9 shows the relation between the temperature of the heat treatment and the coercive force. FIG. 9 shows the coercive force Hc [Oe] of the magnetoresistance element obtained without performing the heat treatment in the step ST4 and the coercive force Hc [Oe] of the magnetoresistive element (the wafer W having the structure shown in FIG. 4) obtained by performing the heat treatment at two different temperatures at the timing of the step the ST4. The vertical axis in FIG. 9 represents the coercive force Hc [Oe].

A graph G61 shows a value of the coercive force Hc [Oe] of the wafer W having the structure shown in FIG. 4 obtained by performing the heat treatment at 400° C. at the timing of the step ST4. A Graph G62 shows a value of the coercive force Hc [Oe] of the wafer W having the structure shown in FIG. 4 obtained by performing the heat treatment at 300° C. at the timing of the step ST4. A graph G63 shows a value of the coercive force Hc [Oe] of the magnetoresistive element obtained without performing the heat treatment in the step ST4. The results shown in FIG. 9 indicate that the value of the coercive force Hc [Oe] of the wafer W having the structure shown in FIG. 4 obtained by performing the heat treatment at the timing of the step ST4 is higher than the value of the coercive force Hc [Oe] of the magnetoresistive element obtained without performing the heat treatment in the step ST4.

FIG. 10 explains the effect of the heat treatment. FIG. 10 shows the coercive force Hc [Oe] of the magnetoresistive element obtained without performing the heat treatment and the coercive force Hc [Oe] of the magnetoresistive element (the wafer W having the structure shown in FIG. 4) obtained by performing the heat treatment at a plurality of different timings. The vertical axis in FIG. 10 represents the coercive force Hc [Oe].

A graph G71 shows a value of the coercive force Hc [Oe] of the magnetoresistive element obtained without performing the heat treatment. A graph G72 shows a value of the coercive force Hc [Oe] of the magnetoresistive element obtained by performing the heat treatment at the timing immediately after the formation of the ferromagnetic layer ML2. A graph G73 shows ae value of the coercive force Hc [Oe] of the magnetoresistive element (wafer W) having the structure shown in FIG. 4 obtained by performing the heat treatment at the timing of the step ST4, i.e., at the timing of forming the absorbing layer AL. A graph G74 shows a value of the coercive force Hc [Oe] of the magnetoresistive element obtained by performing the heat treatment at the timing immediately after the formation of the ferromagnetic layer ML3. A graph G75 shows a value of the coercive force Hc [Oe] of the magnetoresistive element obtained by performing the heat treatment at the timing immediately after the formation of the oxide layer IL2. The results shown in FIG. 10 indicate that the coercive force Hc [Oe] of the wafer W having the structure shown in FIG. 4 obtained by performing the heat treatment is relatively high, and the coercive force Hc [Oe] of the magnetoresistance element obtained by performing the heat treatment at other timings (graph G72, graph G74, and graph G75) or without performing the heat treatment (graph G71) is relatively low.

As shown in FIGS. 6 to 10, boron atoms of the ferromagnetic layer ML2 are absorbed by the absorbing layer AL by the heat treatment in the step ST4 and, thus, the concentration of boron atoms of the ferromagnetic layer ML2 is decreased and the magnetic characteristics of the ferromagnetic layer ML2 are improved. Accordingly, the wafer W having the structure shown in FIG. 4 obtained by performing the heat treatment at the timing of the step ST4 exhibits good magnetic characteristics.

According to research conducted by the present inventors, the magnetic characteristics such as an anisotropic magnetic field Hk and the like were improved by performing the heat treatment at the timing of the step ST4, i.e., at the timing of laminating the ferromagnetic layer ML2 and the absorbing layer AL in that order on the oxide layer IL1. In the case of performing the heat treatment at the timing of the step ST4, the boron atoms moved from the ferromagnetic layer ML2 by the heat treatment are absorbed by the absorbing layer AL and, thus, the concentration of the boron atoms in the ferromagnetic layer ML 2 is reduced. Accordingly, the magnetic characteristics of the ferromagnetic layer ML2 are improved.

According to the research conducted by the present inventors, it has been found that when the thickness of the absorbing layer AL is within the range from 0.1 nm to 1.0 nm, the absorbing layer AL can sufficiently absorb the boron atoms moved from the ferromagnetic layer ML2.

According to the research conducted by the present inventors, it has been found that good magnetic characteristics such as the anisotropic magnetic field Hk and the like can be realized when the heat treatment in the step ST4 is performed at the temperature ranging from 300° C. to 450° C.

Since the formation of the ferromagnetic layer ML2, the formation of the absorbing layer AL, and the heat treatment for crystallizing the ferromagnetic layer ML2 are performed in a consistent vacuum environment that can be provided by the processing system 100, it is possible to control the environment during processing without exposure to the atmosphere and also possible to simplify the processing steps.

In the case where the heat treatment is performed in an environment in which a magnetic field is applied, the magnetization direction of the ferromagnetic layer ML2 can be aligned, which makes it possible to further improve the magnetic characteristics.

After the ferromagnetic layer ML2 is crystallized by the heat treatment in the step ST4, other layers such as the ferromagnetic layer ML3, the oxide layer IL2, and the like are sequentially laminated on the crystallized ferromagnetic layer ML2 (through the absorbing layer AL). Therefore, the ferromagnetic layer ML2 can be satisfactorily crystallized without being affected by the crystal structure of other layers laminated on the ferromagnetic layer ML 2 (through the absorbing layer AL).

The absorbing layer AL may be made of any one of tungsten, molybdenum, tantalum, chromium, vanadium and niobium which are suitable for absorption of boron. The ferromagnetic property of the ferromagnetic layer ML 2 can be realized by a material containing cobalt, iron and boron. The oxide layer IL1 disposed between the ferromagnetic layer ML1 and the ferromagnetic layer ML2 can be made of magnesium oxide.

While the principle of the present disclosure has been illustrated and described in the above embodiments, it is recognized by those skilled in the art that the present disclosure can be modified in arrangement and details without departing from the principle. The present disclosure is not limited to the specific configurations disclosed in the above embodiments. Therefore, the applicants claim all modifications and changes falling within the scope of claims and resulting from the scope of spirit thereof.

While the present disclosure has been shown and described with respect to the embodiments, it will be understood by those skilled in the art that various changes and modifications may be made without departing from the scope of the present disclosure as defined in the following claims.

What is claimed is:

1. A method for manufacturing a magnetoresistive element, comprising:
    a first step of preparing a wafer including a first ferromagnetic layer and a first oxide layer provided directly on the first ferromagnetic layer;
    a second step of forming, after the first step, a second ferromagnetic layer directly on the first oxide layer;
    a third step of forming, after the second step, an absorbing layer directly on the second ferromagnetic layer; and
    a fourth step of crystallizing, after the third step and before forming a third ferromagnetic layer directly on the absorbing layer, the second ferromagnetic layer by heat treatment,
    wherein the second ferromagnetic layer contains boron, and
    the absorbing layer contains a material for absorbing boron from the second ferromagnetic layer by the heat treatment in the fourth step.

2. The method of claim 1, wherein a film thickness of the absorbing layer ranges from 0.1 nm to 1.0 nm.

3. The method of claim 1, wherein in the fourth step, the heat treatment is performed at a temperature ranging from 300° C. to 450° C.

4. The method of claim 1, wherein the first step to the fourth step are performed in a consistent vacuum environment.

5. The method of claim 1, wherein in the fourth step, the heat treatment is performed while applying a magnetic field.

6. The method of claim 1, further comprising, after the fourth step, a fifth step of forming the third ferromagnetic layer directly on the absorbing layer and forming a second oxide layer directly on the third ferromagnetic layer.

7. The method of claim 1, wherein the absorbing layer contains any one of tungsten, molybdenum, tantalum, chromium, vanadium, and niobium.

8. The method of claim 1, wherein the second ferromagnetic layer contains cobalt, iron, and boron.

9. The method of claim 1, wherein the first oxide layer contains magnesium oxide.

* * * * *